US007504870B2

(12) United States Patent
McClure et al.

(10) Patent No.: US 7,504,870 B2
(45) Date of Patent: Mar. 17, 2009

(54) POWER-ON RESET CIRCUIT

(75) Inventors: David McClure, Carrollton, TX (US); Robert Mikyska, Dolni Dobrouc (CZ)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 11/696,383

(22) Filed: Apr. 4, 2007

(65) Prior Publication Data
US 2007/0236840 A1  Oct. 11, 2007

Related U.S. Application Data

(60) Provisional application No. 60/790,143, filed on Apr. 7, 2006.

(51) Int. Cl.
*H03L 7/00* (2006.01)
(52) U.S. Cl. .................. 327/143; 327/142; 327/198
(58) Field of Classification Search .................. 327/142, 327/143, 198
See application file for complete search history.

(56) References Cited

U.S. PATENT DOCUMENTS

| 4,581,552 | A | * | 4/1986 | Womack et al. ............. 327/142 |
| 5,115,146 | A | * | 5/1992 | McClure .................... 327/143 |
| 5,455,799 | A | * | 10/1995 | McClure et al. ............. 365/201 |
| 5,477,176 | A | * | 12/1995 | Chang et al. ................ 327/143 |
| 5,479,172 | A | * | 12/1995 | Smith et al. .................. 342/51 |
| 5,610,542 | A | * | 3/1997 | Kang et al. .................. 327/143 |
| 5,627,787 | A | * | 5/1997 | McClure .................... 365/201 |
| 5,781,051 | A | * | 7/1998 | Sandhu ...................... 327/143 |
| 5,959,477 | A | * | 9/1999 | Chung ........................ 327/143 |
| 6,593,790 | B2 | * | 7/2003 | Kim .......................... 327/198 |
| 6,879,194 | B1 | * | 4/2005 | Caldwell .................... 327/143 |
| 7,015,732 | B1 | * | 3/2006 | Holloway et al. .......... 327/143 |
| 7,154,733 | B2 | * | 12/2006 | Sibrai ........................ 361/248 |
| 2002/0005740 | A1 | * | 1/2002 | Kim .......................... 327/143 |
| 2005/0093529 | A1 | * | 5/2005 | Hur ........................... 323/313 |
| 2005/0134334 | A1 | * | 6/2005 | Mikyska ..................... 327/143 |
| 2005/0140406 | A1 | * | 6/2005 | Rizzo et al. ................ 327/143 |
| 2005/0270089 | A1 | * | 12/2005 | Shor et al. .................. 327/539 |

* cited by examiner

*Primary Examiner*—Lincoln Donovan
*Assistant Examiner*—Adam Houston
(74) *Attorney, Agent, or Firm*—Lisa K. Jorgenson; Renee Michelle Leveque

(57) ABSTRACT

A power-on reset circuit. The power-on reset circuit includes a switch, a current source coupled between a first potential and a switch first contact; a resistive device having a resistive-device first contact coupled to the first potential; a first module coupled between a second potential and a switch second contact; a second module coupled between the second potential and resistive-device second contact; and an inverter having an inverter input coupled to the resistive-device second contact. Current through the second module mirrors current through the first module. If a first mirrored potential of the second potential present on a switch control contact is greater than a preselected value, the switch first contact is coupled to the switch second contact. Otherwise, the switch first contact is decoupled from the switch second contact.

17 Claims, 7 Drawing Sheets

POWER-ON RESET CIRCUIT

CROSS-REFERENCE TO RELATED APPLICATIONS

This application claims the benefit of U.S. Provisional Patent Application Ser. No. 60/790,143 filed on 7 Apr. 2006, entitled "Power On Reset Circuitry" which is hereby incorporated by reference in its entirety herein.

BACKGROUND

Following the application of power, the state into which an analog or digital system settles will not be known a priori unless special care is taken. This situation is the result of the fact that some circuits, such as flip-flops in digital circuits, do not inherently favor one condition or state over another. Instead, due to noise and other random influences, they typically end up in one state or the other with more or less equal probability. Often this is an undesirable situation as it can lead to unpredictable results in system functioning. To alleviate such situations, power-on reset circuits are often included in the design of digital and analog systems. The intent of a power-on reset circuit is to force a given system or circuit into a known state during system power-up. Circuitry internal to the system or signals from an external source can be used to place the system in a known state.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. In these drawings, like reference numerals identify corresponding elements.

DETAILED DESCRIPTION

Figure 1:
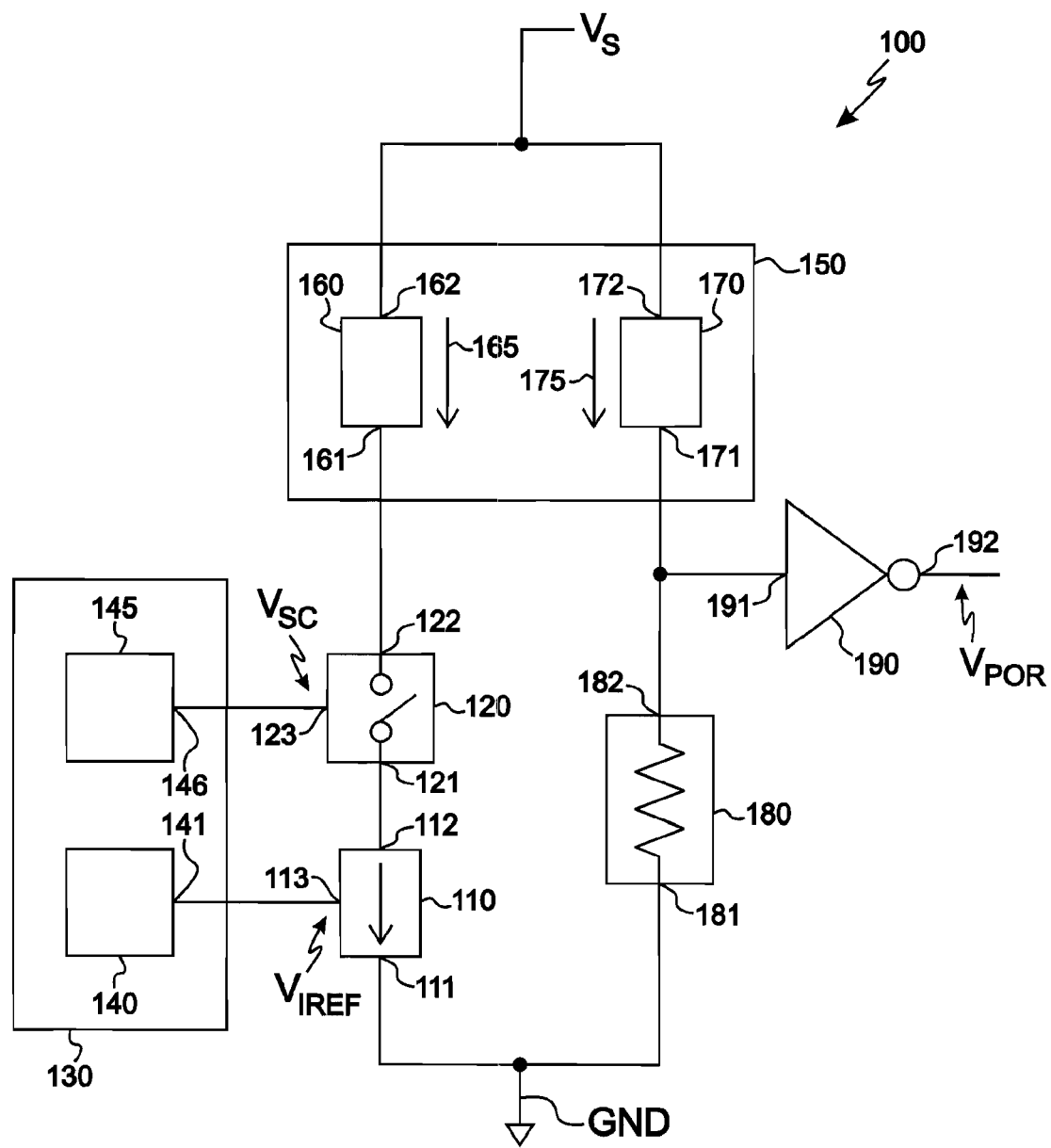
FIG. 1 is a block diagram of a power-on reset circuit as described in various representative embodiments.

As shown in the drawings for purposes of illustration, novel techniques are disclosed herein for a power-on reset circuit which can be configured to operate with low current and low power requirements. Limiting the current in a power-on reset circuit is important in order to prevent exceeding specified device currents at lower supply levels. The power-on reset circuit outputs a signal which is asserted until the supply voltage rises above a preselected level during power-up. This signal can be used to initialize circuitry, including comparator outputs, flip-flops, fuse states, and the like. Previous circuits have typically not included the attributes of both current limiting and low power consumption.

In the following detailed description and in the several figures of the drawings, like elements are identified with like reference numerals.

FIG. 1 is a block diagram of a power-on reset circuit 100 as described in various representative embodiments. In FIG. 1, the power-on reset circuit 100 comprises a current source 110, a switch 120, a current mirror 150, a resistive device 180, and an inverter 190. More generally, the inverter 190 could be a logic gate 190 having a logic gate input 191 and a logic gate output 192. The current mirror 150 comprises a first module 160 and a second module 170. The current source 110 has a current-source first contact 111, a current-source second contact 112, and a current-source control contact 113; the switch 120 has a switch first contact 121, a switch second contact 122, and a switch control contact 123; the first module 160 has a first-module first contact 161 and a first-module second contact 162; the second module 170 has a second-module first contact 171 and a second-module second contact 172; the resistive device 180 has a resistive-device first contact 181 and a resistive-device second contact 182; and the inverter 190 has an inverter input 191 (logic gate input 191) and an inverter output 192 (logic gate output 192).

Also shown in FIG. 1 is a reference circuit 130 comprising a current-control circuit 140 and a switch-control circuit 145. The current-control circuit 140 has a current-control-circuit output 141, and the switch-control circuit 145 has a switch-control-circuit output 146.

The current-source first contact 111 is coupled to a first potential GND which could be at ground potential, and the current-source second contact 112 is coupled to the switch first contact 121. Thus, the current source 110 is coupled between the first potential GND and the switch first contact 121. The first-module first contact 161 is coupled to the switch second contact 122 and the first-module second contact 162 is coupled to a second potential $V_S$ which may also be referred to herein as a source potential $V_S$. Thus, the first module 160 is coupled between the second potential $V_S$ and the switch second contact 122. The second-module first contact 171 is coupled to the resistive-device second contact 182 and the second-module second contact 172 is coupled to the source potential $V_S$. The resistive-device first contact 181 is coupled to the first potential GND, and the resistive-device second contact 182 is coupled to the second-module first contact 171. Thus, the second module 170 is coupled between the source potential $V_S$ and the resistive-device second contact 182, and the resistive device 180 is coupled between the first potential GND and the second-module first contact 171. The inverter input 191 is coupled to the resistive-device second contact 182. As will be apparent to a person of ordinary skill in the art, the resistive device 180 could be a resistor, a field effect transistor, or any other appropriate device having a resistance.

In operation, if a first mirrored potential $V_{SC}$ of the source potential $V_S$ present on the switch control contact 123 is greater than a preselected value, the switch 120 is configured so that the switch first contact 121 is coupled to the switch second contact 122 thereby providing coupling between the current-source second contact 112 and the first-module first contact 161. Otherwise, the switch first contact 121 is decoupled from the switch second contact 122 thereby decoupling the current-source second contact 112 from the first-module first contact 161. The first mirrored potential $V_{SC}$ may also be referred to herein as the switch control potential $V_{SC}$. The current source 110 is configured to provide a constant value for a first current 165 if a second mirrored potential $V_{IRef}$ of the source potential $V_S$ is greater than another preselected value. The second mirrored potential $V_{IRef}$ may also be referred to herein as the current-source control potential $V_{IRef}$. The establishment of the first current 165 is indicative that sufficiently large currents are flowing in the reference circuit 130 for it to provide useable control potentials $V_{SC}$, $V_{IRef}$. The first current 165 passing through the first module 160 is mirrored by a second current 175 passing through the second module 170.

Figure 2:
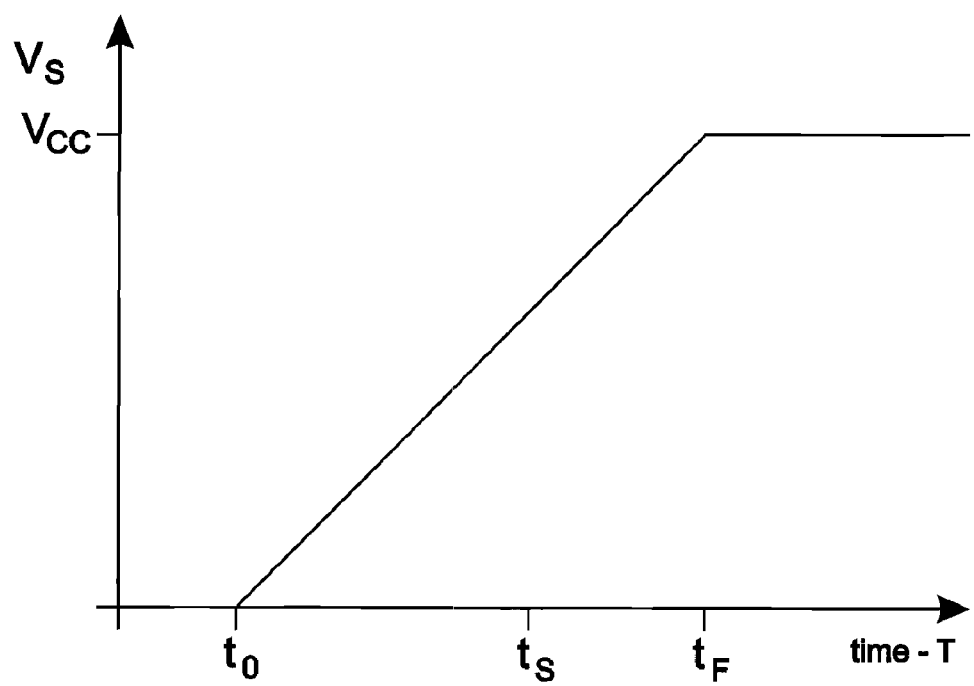
FIG. 2 is a plot of the source potential vs. time for the power-on reset circuit of FIG. 1.

FIG. 2 is a plot of the source potential $V_S$ vs. time T for the power-on reset circuit 100 of FIG. 1. At a start time $t_0$ the source potential $V_S$ is applied to the power-on reset circuit 100. The source potential $V_S$ begins at the start time $t_0$ at zero, begins to increase with time T, and reaches a full supply potential $V_{CC}$ at a final time $t_F$. For purposes of illustration, the plot 200 of FIG. 2 shows the source potential $V_S$ increasing linearly with the time T. However, this is not a performance requirement of the power-on reset circuit 100. The significance of a switch-on time $t_S$ shown in FIG. 2 will be explained in the discussion of FIG. 3.

Figure 3:
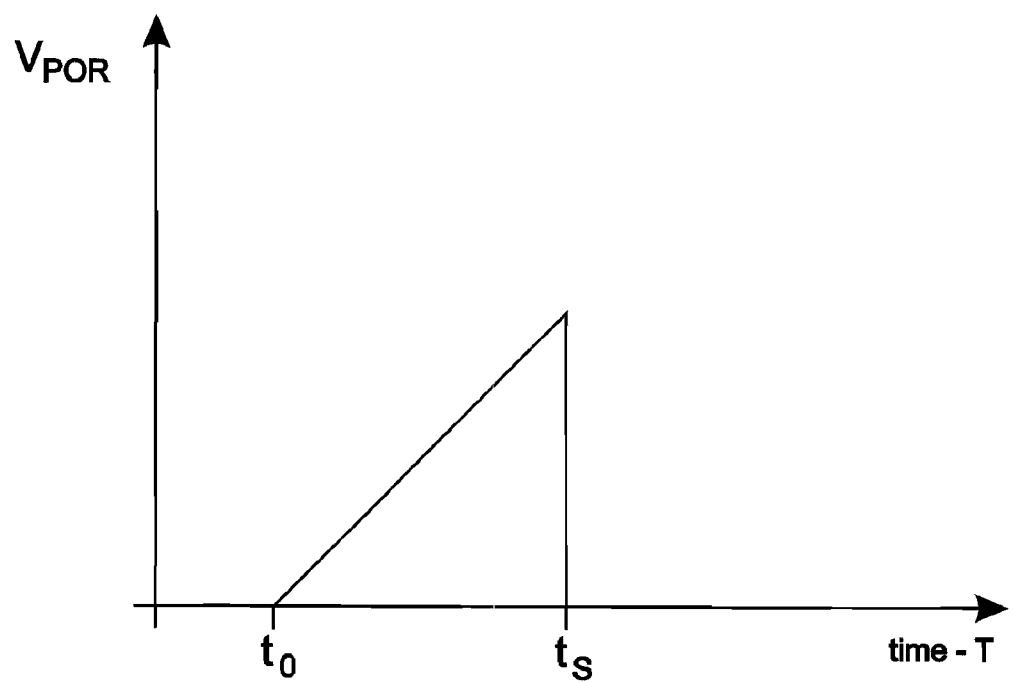
FIG. 3 is a plot of the power-on reset potential vs. time for the power-on reset circuit of FIG. 1.

FIG. 3 is a plot of the power-on reset potential $V_{POR}$ vs. time T for the power-on reset circuit 100 of FIG. 1. Beginning at the start time $t_0$ and continuing until the switch-on time $t_S$, the switch 120 is in the OFF mode with the switch first contact 121 decoupled from the switch second contact 122. In this condition, the first current 165 is zero which results in a zero value for the second current 175. It follows that the inverter input 191 is tied to the first potential GND which results in the power-on reset potential $V_{POR}$ at the inverter output 192 being in its HIGH state and thereby following the source potential $V_S$ with time T. However, at the switch-on time $t_S$, the switch 120 transitions to the ON mode with the switch first contact 121 coupled to the switch second contact 122. In this condition, the first current 165 is locked to a constant value determined by the current-source control potential $V_{IRef}$ which results in a non-zero value for the second current 175. With appropriate choices for the values of the parameters of the second module 170 with resultant influence on the value of the second current 175 and for the value of the resistance of the resistive device 180, the inverter input 191 is then tied to a potential greater than the first potential GND which results in the power-on reset potential $V_{POR}$ at the inverter output 192 dropping to its LOW state which would be at or near the first potential GND.

Figure 4:
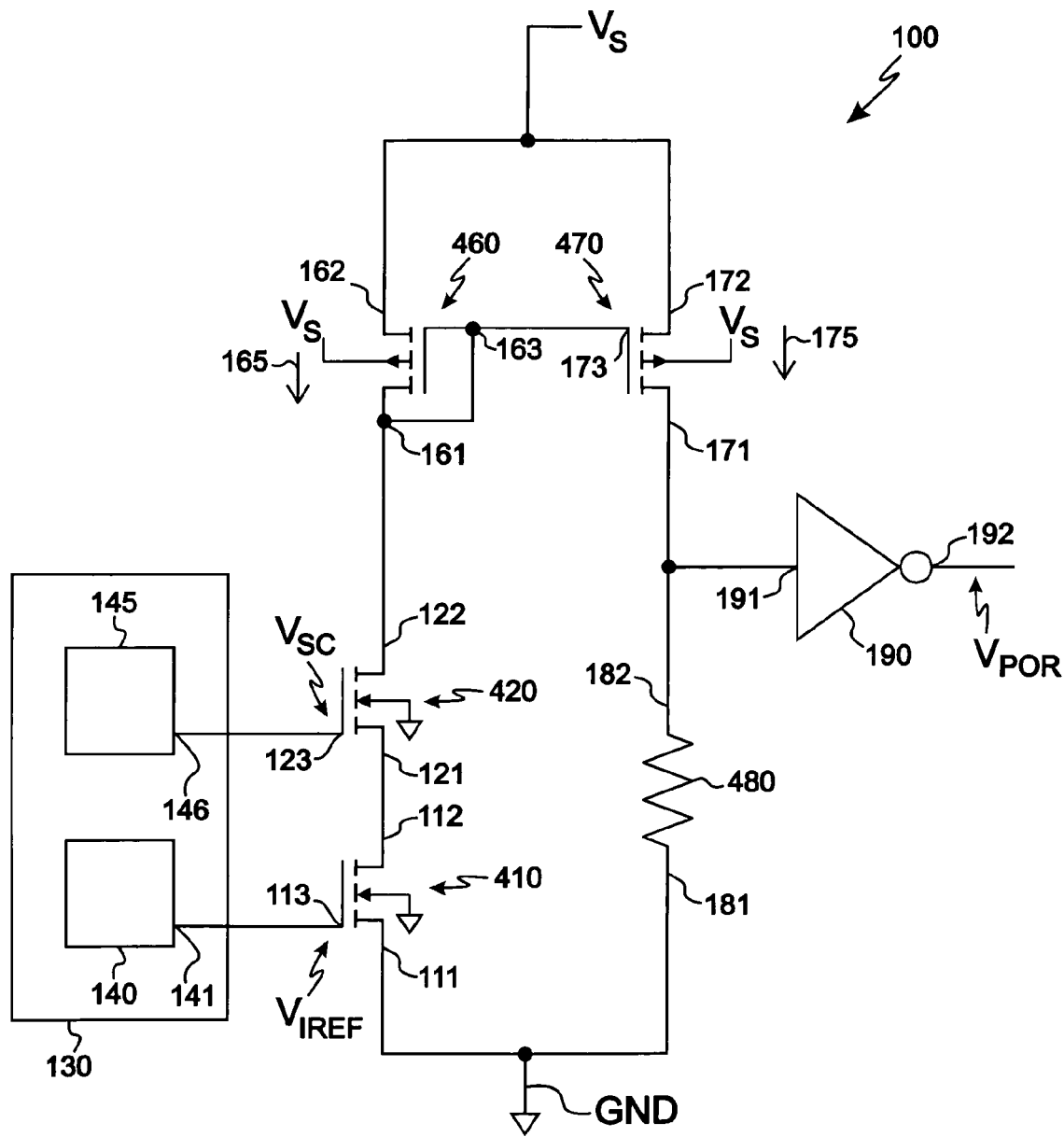
FIG. 4 is a circuit diagram of another power-on reset circuit as described in various representative embodiments.

FIG. 4 is a circuit diagram of another power-on reset circuit 100 as described in various representative embodiments. In FIG. 4, the current source 110 becomes the first field effect transistor 410; the switch 120 becomes the second field effect transistor 420; the first module 160 is the third field effect transistor 460, the second module 170 is the fourth field effect transistor 470, and the resistive device 180 is the resistor 480. As such, the current mirror 150 comprises the third field effect transistor 460 and the fourth field effect transistor 470. In the representative embodiment of FIG. 4, the first field effect transistor 410 and the second field effect transistor 420 are n-channel metal-oxide-semiconductor field effect transistors, and the third field effect transistor 460 and the fourth field effect transistor 470 are p-channel metal-oxide-semiconductor field effect transistors. As will be apparent to one of ordinary skill in the art, in another representative embodiment with appropriate polarities for the first potential GND and the source potential $V_S$, the first field effect transistor 410 and the second field effect transistor 420 could be p-channel metal-oxide-semiconductor field effect transistors, and the third field effect transistor 460 and the fourth field effect transistor 470 would then be n-channel metal-oxide-semiconductor field effect transistors.

In the representative embodiment of FIG. 4, the current-source first contact 111 is the source, the current-source second contact 112 is the drain, and the current-source control contact 113 is the gate of the first field effect transistor 410; the switch first contact 121 is the source, the switch second contact 122 is the drain, and the switch control contact 123 is the gate of the second field effect transistor 420; the first-module first contact 161 is the drain, the first-module second contact 162 is the source, and a first-module control contact 163 is the gate of the third field effect transistor 460; the second-module first contact 171 is the drain, the second-module second contact 172 is the source, and a second-module control contact 173 is the gate of the fourth field effect transistor 470.

As in FIG. 1, FIG. 4 also shows the reference circuit 130 comprising the current-control circuit 140 and the switch-control circuit 145. The current-control circuit 140 has a current-control-circuit output 141, and the switch-control circuit 145 has a switch-control-circuit output 146.

So, the source of the first field effect transistor 410 (the current-source first contact 111) is coupled to a first potential GND which could be at ground potential, and the drain of the first field effect transistor 410 (the current-source second contact 112) is coupled to the source of the second field effect transistor 420 (the switch first contact 121). Thus, the first field effect transistor 410 (the current source 110) is coupled between the first potential GND and the source of the second field effect transistor 420 (the switch first contact 121). The third field effect transistor 460 drain (the first-module first contact 161) is coupled to the drain of the second field effect transistor 420 (the switch second contact 122) and the third field effect transistor 460 source (the first-module second contact 162) is coupled to the source potential $V_S$. Thus, the third field effect transistor 460 (the first module 160) is coupled between the second potential $V_S$ and the drain of the second field effect transistor 420 (the switch second contact 122). The fourth field effect transistor 470 drain (the second-module first contact 171) is coupled to the resistive-device second contact 182 and the fourth field effect transistor 470 source (the second-module second contact 172) is coupled to the source potential $V_S$. The resistive-device first contact 181 is coupled to the first potential GND, and the resistive-device second contact 182 is coupled to the fourth field effect transistor 470 drain (the second-module first contact 171). The third field effect transistor 460 gate (the first-module control contact 163) is coupled to the third field effect transistor 460 drain (the first-module first contact 161) and to the fourth field effect transistor 470 gate (the second-module control contact 173). Thus, the fourth field effect transistor 470 (the second module 170) is coupled between the source potential $V_S$ and the resistive-device second contact 182, and the resistive device 180 is coupled between the first potential GND and the fourth field effect transistor 470 drain (the second-module first contact 171). The inverter input 191 is coupled to the resistive-device second contact 182. Again, as will be apparent to a person of ordinary skill in the art, the resistive device 180 could be a resistor, a field effect transistor, or any other appropriate device having a resistance.

In operation, if a first mirrored potential $V_{SC}$ (the switch control potential $V_{SC}$) of the source potential $V_S$ present on the second field effect transistor 420 gate (the switch control contact 123) is greater than a preselected value, the second field effect transistor 420 (the switch 120) is configured so that the second field effect transistor 420 source (the switch first contact 121) is coupled to second field effect transistor 420 drain (the switch second contact 122) thereby providing coupling between the first field effect transistor 410 drain (the current-source second contact 112) and the third field effect transistor 460 drain (the first-module first contact 161). Otherwise, the second field effect transistor 420 source (the switch first contact 121) is decoupled from the second field effect transistor 420 drain (the switch second contact 122) thereby decoupling the first field effect transistor 410 drain (the current-source second contact 112) from the third field effect transistor 460 drain (the first-module first contact 161). The first field effect transistor 410 (the current source 110) is configured to provide a constant value for a first current 165 if the second mirrored potential $V_{IRef}$ of the source potential $V_S$ is greater than another preselected value. The first current 165 passing from the source to the drain of the third field effect transistor 460 (i.e., through the first module 160) is mirrored by a second current 175 passing from the source to the drain of the fourth field effect transistor 470 (i.e., through the second module 170). The ideal plots of FIGS. 2 and 3 are also representative of the operation of the power-on reset circuit 100 of FIG. 4.

The reference circuit 130 could be configured to be a bandgap voltage reference circuit of the type widely used in integrated circuits to provide a voltage of approximately 1.25 volts which is close to the theoretical bandgap of Silicon at zero degrees Kelvin. The value of the switch control potential $V_{SC}$ could then be about 1.25 volts. Circuitry can be included in the bandgap voltage reference circuit to also obtain the current-source control potential $V_{IRef}$. Other appropriate configurations for the reference circuit 130 and individually the current-control circuit 140 and the switch-control circuit 145 are also possible.

Figure 5:
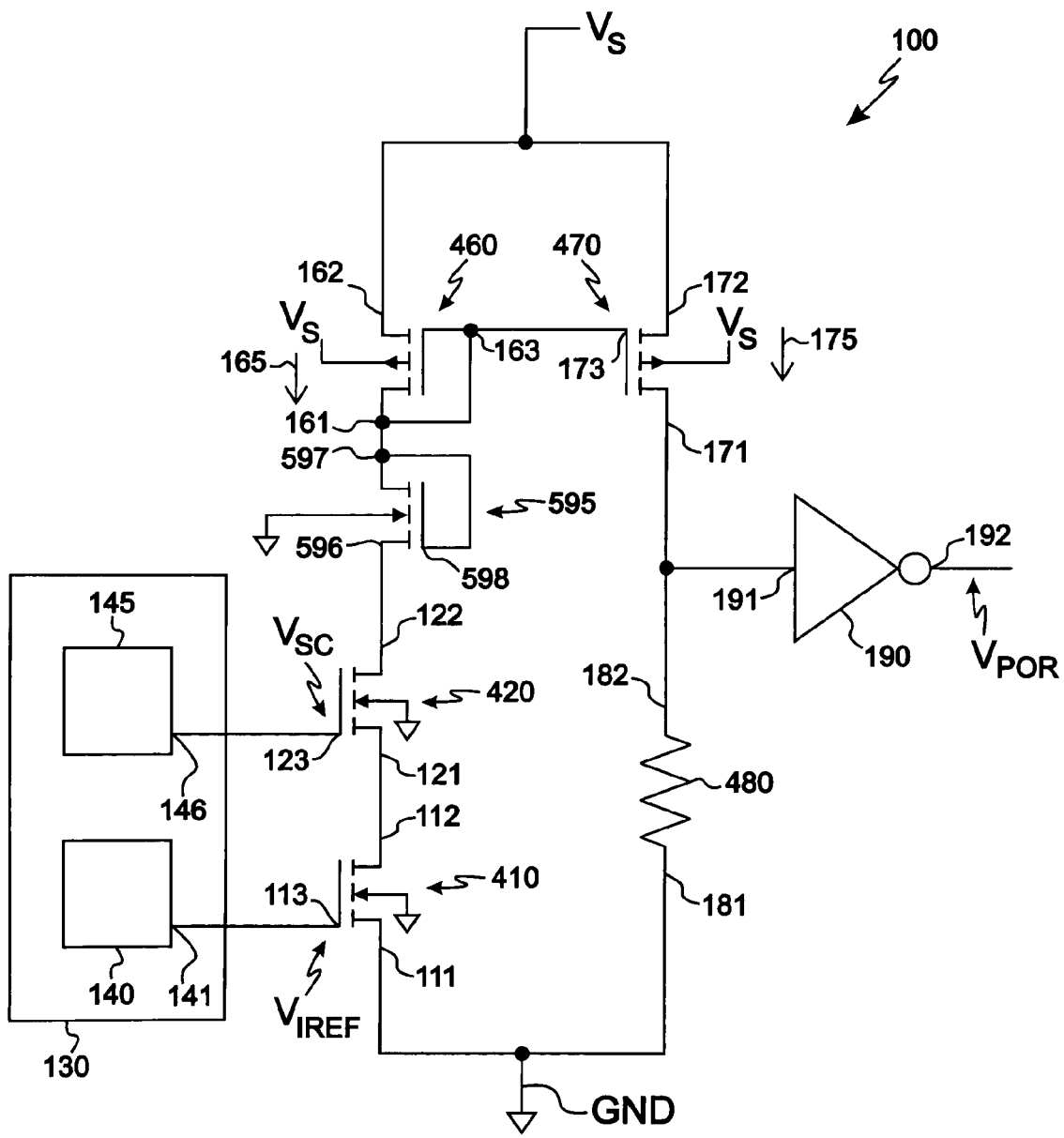
FIG. 5 is a circuit diagram of still another power-on reset circuit as described in various representative embodiments.

FIG. 5 is a circuit diagram of still another power-on reset circuit 100 as described in various representative embodiments. The power-on reset circuit 100 of FIG. 5 is similar to the power-on reset circuit 100 of FIG. 4 with the addition of a fifth field effect transistor 595. The fifth field effect transistor 595 has a fifth-transistor source 596, a fifth-transistor drain 597, and a fifth-transistor gate 598. The fifth field effect transistor 595 is inserted between the second field effect transistor 420 and the third field effect transistor 460 with the second field effect transistor 420 drain coupled to the fifth-transistor source 596, and the fifth-transistor drain 597 and the fifth-transistor gate 598 connected to the third field effect transistor 460 drain.

The operation of the power-on reset circuit 100 of FIG. 5 is similar to that of the power-on reset circuit 100 of FIG. 4 with the ideal plots of FIGS. 2 and 3 also being representative of the operation of the power-on reset circuit 100 of FIG. 5. However, the switch-on time $t_S$ for the power-on reset circuit 100 of FIG. 5 occurs at a greater potential at the drain of the third field effect transistor 460 than for the power-on reset circuit 100 of FIG. 4.

Figure 6:
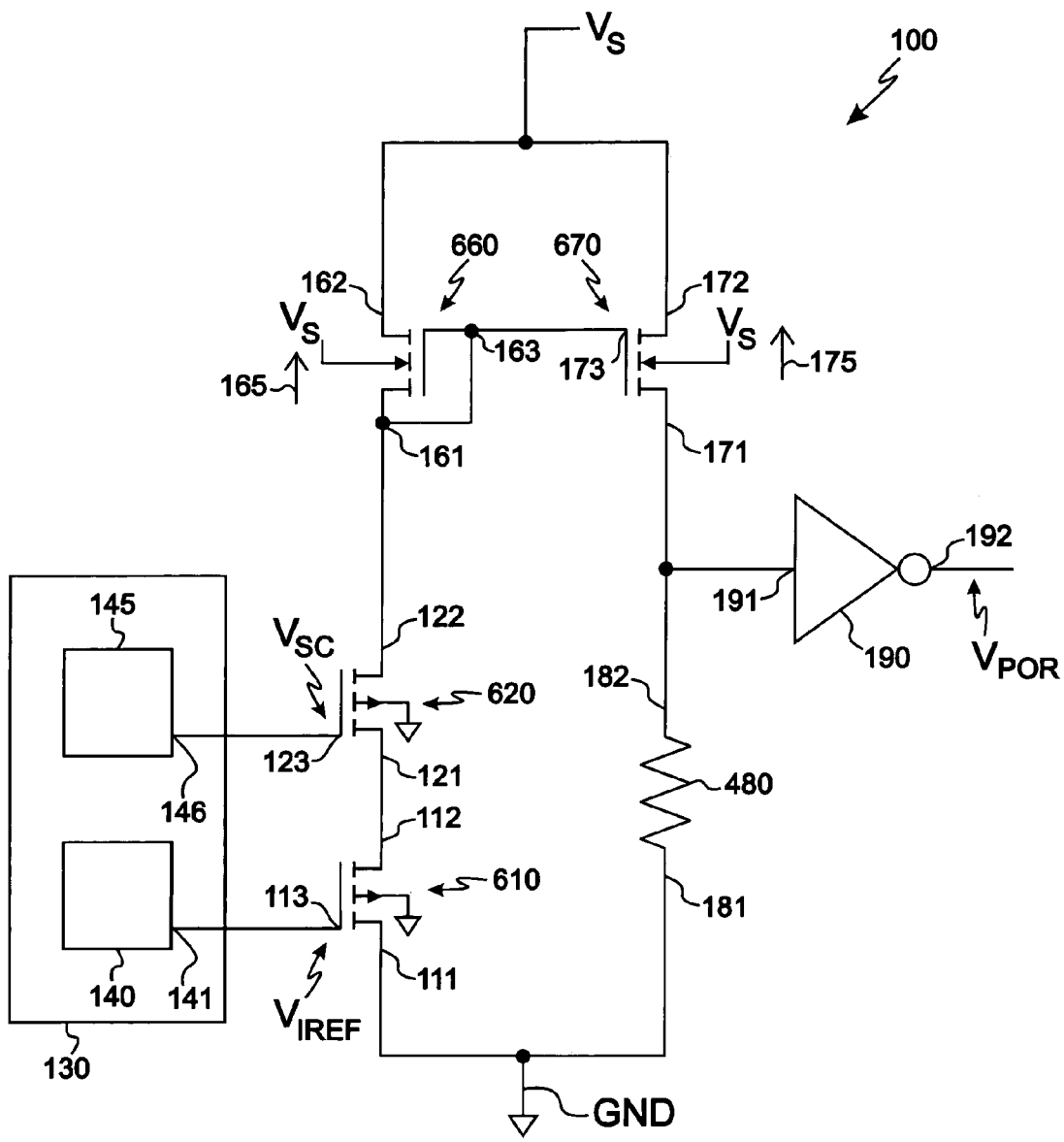
FIG. 6 is a circuit diagram of yet another power-on reset circuit as described in various representative embodiments.

FIG. 6 is a circuit diagram of yet another power-on reset circuit 100 as described in various representative embodiments. In FIG. 6, the current source 110 becomes the sixth field effect transistor 610; the switch 120 becomes the seventh field effect transistor 620; the first module 160 is the eighth field effect transistor 660, the second module 170 is the ninth field effect transistor 670, and the resistive device 180 is the resistor 480. As such, the current mirror 150 comprises the eighth field effect transistor 660 and the ninth field effect transistor 670. In the representative embodiment of FIG. 6, the sixth field effect transistor 610 and the seventh field effect transistor 620 are p-channel metal-oxide-semiconductors field effect transistors. The eighth field effect transistor 660 and the ninth field effect transistor 670 are n-channel metal-oxide-semiconductor field effect transistors.

In the representative embodiment of FIG. 6, the current-source first contact 111 is the source, the current-source second contact 112 is the drain, and the current-source control contact 113 is the gate of the sixth field effect transistor 610; the switch first contact 121 is the source, the switch second contact 122 is the drain, and the switch control contact 123 is the gate of the seventh field effect transistor 620; the first-module first contact 161 is the drain, the first-module second contact 162 is the source, and the first-module control contact 163 is the gate of the eighth field effect transistor 660; the second-module first contact 171 is the drain, the second-module second contact 172 is the source, and the second-module control contact 173 is the gate of the ninth field effect transistor 670.

As in FIG. 1, FIG. 6 also shows the reference circuit 130 comprising the current-control circuit 140 and the switch-control circuit 145. The current-control circuit 140 has a current-control-circuit output 141 coupled to the gate of the sixth field effect transistor 610, and the switch-control circuit 145 has a switch-control-circuit output 146 coupled to the gate of the seventh field effect transistor 620.

So, the source of the sixth field effect transistor 610 (the current-source first contact 111) is coupled to a first potential GND which could be at ground potential, and the drain of the sixth field effect transistor 610 (the current-source second contact 112) is coupled to the source of the seventh field effect transistor 620 (the switch first contact 121). Thus, the sixth field effect transistor 610 (the current source 110) is coupled between the first potential GND and the source of the seventh field effect transistor 620 (the switch first contact 121). The eighth field effect transistor 660 drain (the first-module first contact 161) is coupled to the drain of the seventh field effect transistor 620 (the switch second contact 122), and to the eighth field effect transistor 660 source (the first-module second contact 162) is coupled to the source potential $V_S$. Thus, the eighth field effect transistor 660 (the first module 160) is coupled between the second potential $V_S$ and the drain of the seventh field effect transistor 620 (the switch second contact 122). The ninth field effect transistor 670 drain (the second-module first contact 171) is coupled to the resistive-device second contact 182, and the ninth field effect transistor 670 source (the second-module second contact 172) is coupled to the source potential $V_S$. The resistive-device first contact 181 is coupled to the first potential GND, and the resistive-device second contact 182 is coupled to the ninth field effect transistor 670 drain (the second-module first contact 171). The eighth field effect transistor 660 gate (the first-module control contact 163) is coupled to the eighth field effect transistor 660 drain (the first-module first contact 161) and to the ninth field effect transistor 670 gate (the second-module control contact 173). Thus, the ninth field effect transistor 670 (the second module 170) is coupled between the source potential $V_S$ and the resistive-device second contact 182, and the resistive device 180 is coupled between the first potential GND and the ninth field effect transistor 670 drain (the second-module first contact 171). The inverter input 191 is coupled to the resistive-device second contact 182. Again, as will be apparent to a person of ordinary skill in the art, the resistive device 180 could be a resistor, a field effect transistor having its gate connected to its drain, a metal-insulator-semiconductor field effect transistor having its gate connected to its drain, a bipolar transistor having its gate connected to its collector, or any other appropriate device.

In operation, if a first mirrored potential $V_{SC}$ (the switch control potential $V_{SC}$) of the source potential $V_S$ present on the seventh field effect transistor 620 gate (the switch control contact 123) is algebraically less than a preselected value, the seventh field effect transistor 620 (the switch 120) is configured so that the seventh field effect transistor 620 source (the switch first contact 121) is coupled to seventh field effect transistor 620 drain (the switch second contact 122) thereby providing coupling between the sixth field effect transistor 610 drain (the current- source second contact 112) and the eighth field effect transistor 660 drain (the first-module first contact 161). Otherwise, the seventh field effect transistor 620 source (the switch first contact 121) is decoupled from the seventh field effect transistor 620 drain (the switch second contact 122) thereby decoupling the sixth field effect transistor 610 drain (the current-source second contact 112) from the eighth field effect transistor 660 drain (the first-module first contact 161). The sixth field effect transistor 610 (the current source 110) is configured to provide a constant value for a first current 165 if the second mirrored potential $V_{IRef}$ of the source potential $V_S$ is algebraically less than another reselected value. The first current 165 passing between the source and the drain of the eighth field effect transistor 660 (i.e., through the first module 160) is mirrored by a second current 175 passing from the source to the drain of the ninth field effect transistor 670 (i.e., through the second module 170). The ideal plots of FIGS. 2 and 3 are also representative of the operation of the power-on reset circuit 100 of FIG. 6 with appropriate changes in polarities.

The reference circuit 130 could be configured to be a bandgap voltage reference circuit of the type widely used in integrated circuits to provide a voltage of approximately -1.25 volts which is close to the theoretical bandgap of Silicon at zero degrees Kelvin. The value of the switch control potential $V_{SC}$ could then be about -1.25 volts. Circuitry can be included in the bandgap voltage reference circuit to also obtain the current-source control potential $V_{IRef}$. Other appropriate configurations for the reference circuit 130 and individually the current-control circuit 140 and the switch-control circuit 145 are also possible.

Figure 7:
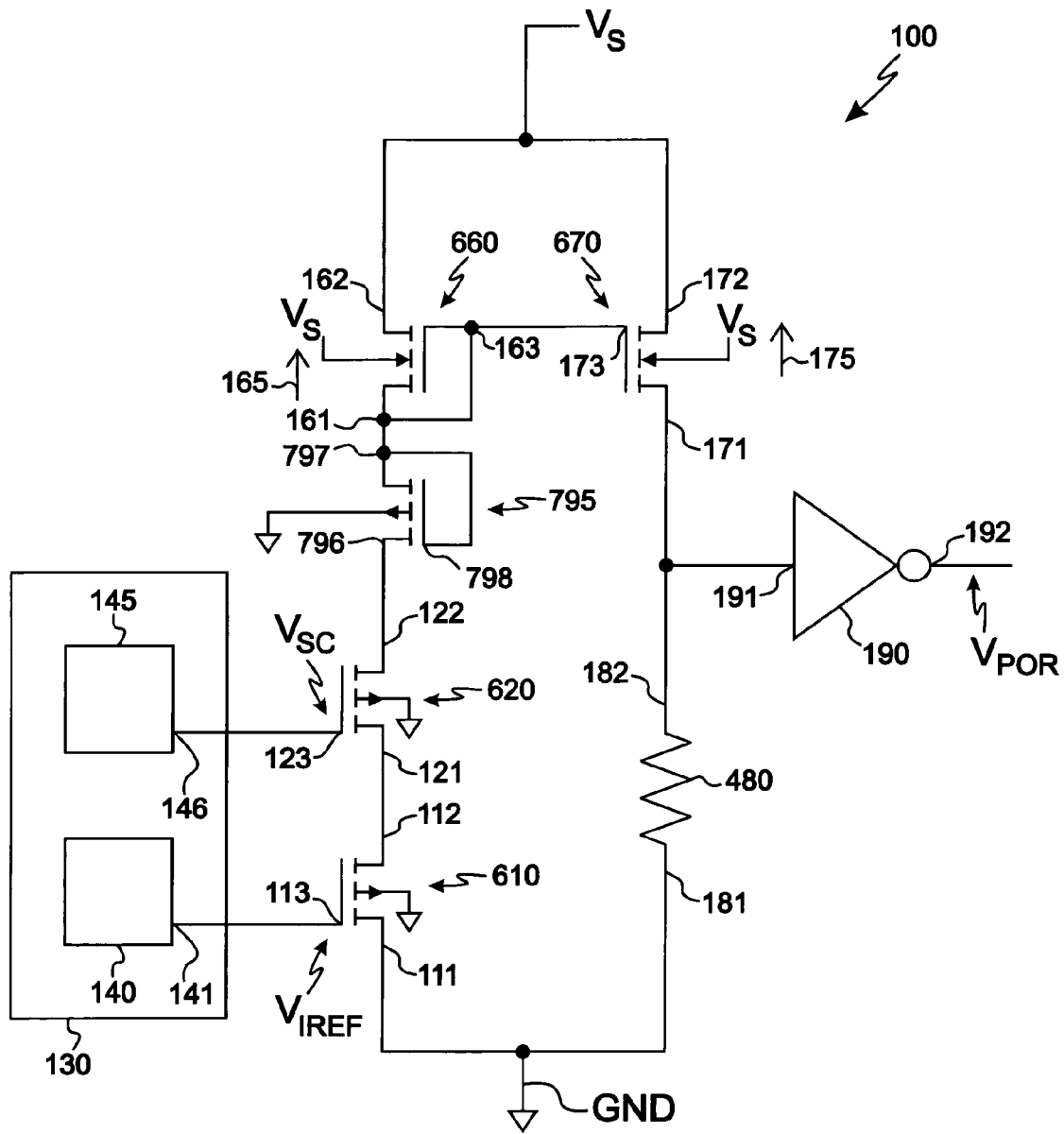
FIG. 7 is a circuit diagram of still yet another power-on reset circuit as described in various representative embodiments.

FIG. 7 is a circuit diagram of still yet another power-on reset circuit 100 as described in various representative embodiments. The power-on reset circuit 100 of FIG. 7 is similar to the power-on reset circuit 100 of FIG. 6 with the addition of a tenth field effect transistor 795. The tenth field effect transistor 795 has a tenth-transistor source 796, a tenth-transistor drain 797, and a tenth-transistor gate 798. The tenth field effect transistor 795 is inserted between the seventh field effect transistor 620 and the eighth field effect transistor 660 with the seventh field effect transistor 620 drain coupled to the tenth-transistor source 796, and the tenth- transistor drain 797 and the tenth-transistor gate 798 connected to the eighth field effect transistor 660 drain.

The operation of the power-on reset circuit 100 of FIG. 7 is similar to that of the power-on reset circuit 100 of FIG. 6 with the ideal plots of FIGS. 2 and 3 with appropriate polarity changes also being representative of the operation of the power-on reset circuit 100 of FIG. 7. However, the switch-on time $t_S$ for the power-on reset circuit 100 of FIG. 7 occurs at a greater negative potential at the drain of the eighth field effect transistor 660 than for the power-on reset circuit 100 of FIG. 6.

Figure 8:
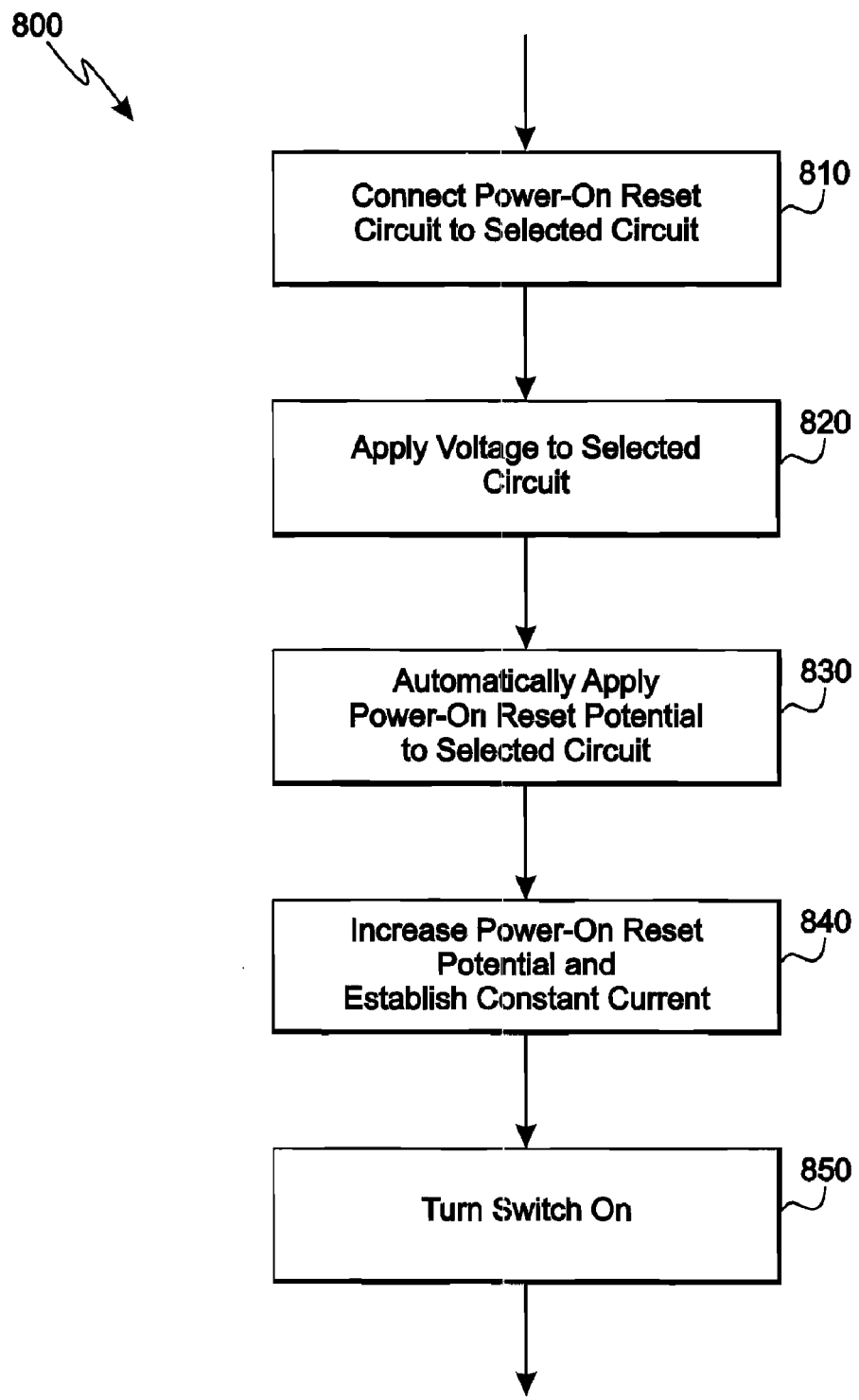
FIG. 8 is a flow chart of a method for applying a power-on reset potential to a circuit as described in various representative embodiments.

FIG. 8 is a flow chart of a method 800 for applying a power-on reset potential $V_{POR}$ to a selected circuit as described in various representative embodiments. In block 810, the power-on reset circuit 100 as shown, for example, in FIG. 1,4,5,6, or 7 is connected to a selected circuit. Block 810 then transfers control to block 820.

In block 820, the source potential $V_S$ is applied to the power-on reset circuit 100 as shown, for example, in FIGS. 1, 4, 5, 6, and 7. Block 820 then transfers control to block 830.

In block 830, the power-on reset potential $V_{POR}$ of the power-on reset circuit 100 is applied automatically to the selected circuit. Block 830 then transfers control to block 840.

In block 840, power-on reset potential $V_{POR}$ applied to the selected circuit increases as the source potential $V_S$ increases as has been described for FIGS. 1, 4, 5, 6, and 7 and as shown in FIG. 3, and as appropriate the condition for generating the constant first current 165 is established as discussed above. Block 840 then transfers control to block 850.

In block 850, the switch 120 is forced into its ON mode thereby driving the power-on reset potential $V_{POR}$ to the LOW state. The selected circuit is then in a preselected state. Block 850 then terminates the process.

In representative embodiments, power-on reset circuits have been disclosed which can be configured to operate with low current and low power requirements. Limiting the current in a power-on reset circuit is important in order to prevent exceeding specified device currents at lower supply levels. The power-on reset circuit outputs a signal which is asserted until the supply voltage rises above a preselected level during power-up. This signal can be used to initialize circuitry, including comparator outputs, flip-flops, fuse states, and the like. Thus, the selected circuit can be placed in a known state following the application of power to it.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A power-on reset circuit, comprising:
   a switch having a switch first contact, a switch second contact, and a switch control contact;
   a current source coupled between a first potential and the switch first contact;
   a resistive device having a resistive-device first contact coupled to the first potential and having a resistive-device second contact,
      wherein the resistive device is an electronic device selected from the group consisting of a resistor, a field effect transistor having its gate coupled to its drain, a metal-insulator-semiconductor field effect transistor having its gate coupled to its drain, or a bipolar transistor having its base coupled to its collector;
   a first module coupled between a second potential and the switch second contact;
   a second module coupled between the second potential and the resistive-device second contact,
   wherein a first current passing through the first module is mirrored by a second current passing through the second module,
   wherein if the second potential is algebraically greater than the first potential and a first mirrored potential of the second potential present on the switch control contact is algebraically greater than a preselected value or if the second potential is algebraically less than the first potential and the first mirrored potential of the second potential present on the switch control contact is algebraically less than a preselected value:
      the switch first contact is coupled to the switch second contact,
   otherwise:
      the switch first contact is decoupled from the switch second contact, and wherein the current source is configured to provide a constant first current if the second potential is algebraically greater than the first potential and a second mirrored potential of the second potential is algebraically greater than another preselected value or if the second potential is algebraically less than the first potential and the second mirrored potential of the second potential is algebraically less than the another preselected value; and a logic gate having a logic gate input coupled to the resistive-device second contact and having a logic gate output.

2. The power-on reset circuit as recited in claim 1,
wherein the logic gate is an inverter.

3. The power-on reset circuit as recited in claim 1,
wherein the switch is an electronic device selected from the group consisting of a three terminal active electronic device, a field effect transistor, a metal-insulator-semiconductor field effect transistor, a bipolar transistor, or a vacuum tube.

4. The power-on reset circuit as recited in claim 1,
wherein the switch is a n-channel metal-oxide- semiconductor second field effect transistor,
wherein the switch first contact is the source of the second field effect transistor,
wherein the switch second contact is the drain of the second field effect transistor, and
wherein the switch control contact is the gate of the second field effect transistor.

5. The power-on reset circuit as recited in claim 1,
wherein the switch is a p-channel metal-oxide- semiconductor seventh field effect transistor,
wherein the switch first contact is the source of the seventh field effect transistor,
wherein the switch second contact is the drain of the seventh field effect transistor, and
wherein the switch control contact is the gate of the seventh field effect transistor.

6. The power-on reset circuit as recited in claim 1,
wherein the current source is an electronic device selected from the group consisting of a three terminal active electronic device, a field effect transistor, a metal- insulator-semiconductor field effect transistor, a bipolar transistor, or a vacuum tube.

7. The power-on reset circuit as recited in claim 1,
wherein the current source is a n-channel metal-oxide- semiconductor first field effect transistor,
wherein the current source has a current-source first contact coupled to the first potential, a current-source second contact coupled to the switch first contact, and a current-source control contact coupled to the second mirrored potential,
wherein the current-source first contact is the source of the first field effect transistor,
wherein the current-source second contact is the drain of the first field effect transistor, and
wherein the current-source control contact is the gate of the first field effect transistor.

8. The power-on reset circuit as recited in claim 1,
wherein the current source is a p-channel metal-oxide-semiconductor sixth field effect transistor,
wherein the current source has a current-source first contact coupled to the first potential, a current-source second contact coupled to the switch first contact, and a current-source control contact coupled to the second mirrored potential,
wherein the current-source first contact is the source of the sixth field effect transistor,
wherein the current-source second contact is the drain of the sixth field effect transistor, and
wherein the current-source control contact is the gate of the sixth field effect transistor.

9. The power-on reset circuit as recited in claim 1,
wherein the first module is an electronic device selected from the group consisting of a three terminal active electronic device, a field effect transistor, a metal- insulator-semiconductor field effect transistor, a bipolar transistor, or a vacuum tube.

10. The power-on reset circuit as recited in claim 1,
wherein the second module is an electronic device selected from the group consisting of a three terminal active electronic device, a field effect transistor, a metal- insulator-semiconductor field effect transistor, a bipolar transistor, or a vacuum tube.

11. The power-on reset circuit as recited in claim 1,
wherein the first module is a p-channel metal-oxide- semiconductor third field effect transistor,
wherein the first module has a first-module first contact coupled to the switch second contact and a first-module second contact coupled to the second potential,
wherein the first-module first contact is the drain of the third field effect transistor,
wherein the first-module second contact is the source of the third field effect transistor,
wherein the gate of the third field effect transistor is coupled to the drain of the third field effect transistor,
wherein the second module is a p-channel metal-oxide-semiconductor fourth field effect transistor,
wherein the second module has a second-module first contact coupled to the resistive-device second contact and a second-module second contact coupled to the second potential,
wherein the second-module first contact is the drain of the fourth field effect transistor,
wherein the second-module second contact is the source of the fourth field effect transistor, and
wherein the gate of the fourth field effect transistor is coupled to the drain of the third field effect transistor.

12. The power-on reset circuit as recited in claim 11,
wherein the first current passing between the source and the drain of the third field effect transistor is mirrored by the second current passing between the source and the drain of the fourth field effect transistor.

13. The power-on reset circuit as recited in claim 1,
wherein the first module is a n-channel metal-oxide- semiconductor eighth field effect transistor,
wherein the first module has a first-module first contact coupled to the switch second contact and a first-module second contact coupled to the second potential,
wherein the first-module first contact is the drain of the eighth field effect transistor,
wherein the first-module second contact is the source of the eighth field effect transistor,
wherein the gate of the eighth field effect transistor is coupled to the drain of the eighth field effect transistor,
wherein the second module is a n-channel metal-oxide-semiconductor ninth field effect transistor,
wherein the second module has a second-module first contact coupled to the resistive-device second contact and a second-module second contact coupled to the second potential,
wherein the second-module first contact is the drain of the ninth field effect transistor,
wherein the second-module second contact is the source of the ninth field effect transistor, and wherein the gate of the ninth field effect transistor is coupled to the drain of the eighth field effect transistor.

14. The power-on reset circuit as recited in claim 13, wherein the first current passing between the source and the drain of the eighth field effect transistor is mirrored by the second current passing between the source and the drain of the ninth field effect transistor.

15. A power-on reset circuit, comprising:
a switch having a switch first contact, a switch second contact, and a switch control contact;
a current source coupled between a first potential and the switch first contact;
a resistive device having a resistive-device first contact coupled to the first potential and having a resistive-device second contact:
a first module coupled between a second potential and the switch second contact;
a second module coupled between the second potential and the resistive-device second contact.
wherein a first current passing through the first module is mirrored by a second current passing through the second module,
wherein if the second potential is algebraically greater than the first potential and a first mirrored potential of the second potential present on the switch control contact is algebraically greater than a preselected value or if the second potential is algebraically less than the first potential and the first mirrored potential of the second potential present on the switch control contact is algebraically less than a preselected value:
the switch first contact is coupled to the switch second contact,
otherwise:
the switch first contact is decoupled from the switch second contact, and
wherein the current source is configured to provide a constant first current if the second potential is algebraically greater than the first potential and a second mirrored potential of the second potential is algebraically greater than another preselected value or if the second potential is algebraically less than the first potential and the second mirrored potential of the second potential is algebraically less than the another preselected value; a logic gate having a logic gate input coupled to the resistive-device second contact and having a logic gate output,
wherein the switch is a n-channel metal-oxide- semiconductor second field effect transistor,
wherein the switch first contact is the source of the second field effect transistor,
wherein the switch second contact is the drain of the second field effect transistor,
wherein the switch control contact is the gate of the second field effect transistor,
wherein the second module is a p-channel metal-oxide-semiconductor fourth field effect transistor,
wherein the second module has a second-module first contact coupled to the resistive-device second contact and a second-module second contact coupled to the second potential,
wherein the second-module first contact is the drain of the fourth field effect transistor,
wherein the second-module second contact is the source of the fourth field effect transistor, and
wherein the gate of the fourth field effect transistor is coupled to the drain of the third field effect transistor; and a n-channel metal-oxide-semiconductor fifth field effect transistor placed between the drain of the second field effect transistor and the drain of the third field effect transistor,
wherein the source of the fifth field effect transistor is coupled to the drain of the second field effect transistor,
wherein the drain of the fifth field effect transistor is coupled to the drain of the third field effect transistor, and
wherein the gate of the fifth field effect transistor is coupled to the drain of the fifth field effect transistor.

16. A power-on reset circuit, comprising:
a switch having a switch first contact, a switch second contact, and a switch control contact;
a current source coupled between a first potential and the switch first contact;
a resistive device having a resistive-device first contact coupled to the first potential and having a resistive-device second contact;
a first module coupled between a second potential and the switch second contact;
a second module coupled between the second potential and the resistive-device second contact,
wherein a first current passing through the first module is mirrored by a second current passing through the second module,
wherein if the second potential is algebraically greater than the first potential and a first mirrored potential of the second potential present on the switch control contact is algebraically greater than a preselected value or if the
second potential is algebraically less than the first potential and the first mirrored potential of the second potential present on the switch control contact is algebraically less than a preselected value:
the switch first contact is coupled to the switch second contact,
otherwise:
the switch first contact is decoupled from the switch second contact, and
wherein the current source is configured to provide a constant first current if the second potential is algebraically greater than the first potential and a second mirrored potential of the second potential is algebraically greater than another preselected value or if the second potential is algebraically less than the first potential and the second mirrored potential of the second potential is algebraically less than the another preselected value; a logic gate having a logic gate input coupled to the resistive-device second contact and having a logic gate output,
wherein the switch is a p-channel metal-oxide- semiconductor seventh field effect transistor,
wherein the switch first contact is the source of the seventh field effect transistor,
wherein the switch second contact is the drain of the seventh field effect transistor,
wherein the switch control contact is the gate of the seventh field effect transistor,
wherein the current source is a p-channel metal-oxide-semiconductor sixth field effect transistor,
wherein the current source has a current-source first contact coupled to the first potential, a current-source second contact coupled to the switch first contact, and a current-source control contact coupled to the second mirrored potential,
wherein the current-source first contact is the source of the sixth field effect transistor, wherein the current-source second contact is the drain of the sixth field effect transistor, wherein the current-source control contact is the gate of the sixth field effect transistor, wherein the first module is a n-channel metal-oxide- semiconductor eighth field effect transistor, wherein the first module has a first-module first contact coupled to the switch second contact and a first-module second contact coupled to the second potential, wherein the first-module first contact is the drain of the eighth field effect transistor, wherein the first-module second contact is the source of the eighth field effect transistor, wherein the gate of the eighth field effect transistor is coupled to the drain of the eighth field effect transistor, wherein the second module is a n-channel metal-oxide-semiconductor ninth field effect transistor, wherein the second module has a second-module first contact coupled to the resistive-device second contact and a second-module second contact coupled to the second potential, wherein the second-module first contact is the drain of the ninth field effect transistor, wherein the second-module second contact is the source of the ninth field effect transistor, and wherein the gate of the ninth field effect transistor is coupled to the drain of the eighth field effect transistor, and a p-channel metal-oxide-semiconductor tenth field effect transistor placed between the drain of the seventh field effect transistor and the drain of the eighth field effect transistor, wherein the source of the tenth field effect transistor is coupled to the drain of the seventh field effect transistor, wherein the drain of the tenth field effect transistor is coupled to the drain of the eighth field effect transistor, and wherein the gate of the tenth field effect transistor is coupled to the drain of the tenth field effect transistor.

17. A method for applying a power-on reset potential to a selected circuit, comprising:

coupling the power-on reset circuit to the selected circuit;

applying a second potential to the power-on reset circuit;

automatically applying the power-on reset potential of the power- on reset circuit to the selected circuit; and increasing the power-on reset potential applied to the selected circuit as the second potential increases and establishing as appropriate the condition for generating a constant first current, wherein the power-on reset circuit includes:

a switch having a switch first contact, a switch second contact, and a switch control contact, a current source coupled between a first potential and the switch first contact, a resistive device, having a resistive-device first contact coupled to the first potential and a resistive-device second contact, a first module coupled between the second potential and the switch second contact, a second module coupled between the second potential and the resistive-device second contact, wherein the first current passing through the first module is mirrored by a second current passing through the second module, wherein if the second potential is algebraically greater than the first potential and a first mirrored potential of the second potential present on the switch control contact is algebraically greater than a preselected value or if the second potential is algebraically less than the first potential and the first mirrored potential of the second potential present on the switch control contact is algebraically less than a preselected value:

decoupling the switch first contact from the switch second contact, otherwise:

coupling the switch first contact to the switch second contact thereby driving the power-on reset potential to the LOW state resulting in the selected circuit being in a preselected state, and wherein the current source is configured to provide the constant first current if the second potential is algebraically greater than the first potential and a second mirrored potential of the second potential is algebraically greater than another preselected value or if the second potential is algebraically less than the first potential and the second mirrored potential of the second potential is algebraically less than the another preselected value; and a logic gate having a logic gate input coupled to the resistive-device second contact and a logic gate output, wherein the power-on reset potential is present at the logic gate output, wherein the resistive device is an electronic device selected from the group consisting of a resistor, a field effect transistor having its gate coupled to its drain, a metal-insulator-semiconductor field effect transistor having its gate coupled to its drain, or a bipolar transistor having its base coupled to its collector.

* * * * *